United States Patent
Kobayakawa

(10) Patent No.: US 10,008,650 B2
(45) Date of Patent: Jun. 26, 2018

(54) SEMICONDUCTOR LIGHT-EMITTING DEVICE

(71) Applicant: ROHM CO., LTD., Kyoto-shi, Kyoto (JP)

(72) Inventor: Masahiko Kobayakawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days. days.

(21) Appl. No.: 14/703,273

(22) Filed: May 4, 2015

(65) Prior Publication Data

US 2015/0236231 A1  Aug. 20, 2015

Related U.S. Application Data

(60) Continuation of application No. 14/574,640, filed on Dec. 18, 2014, now Pat. No. 9,059,387, which is a continuation of application No. 14/184,173, filed on Feb. 19, 2014, now Pat. No. 8,946,763, which is a continuation of application No. 14/021,501, filed on Sep. 9, 2013, now Pat. No. 8,680,568, which is a continuation of application No. 13/414,294, filed on Mar. 7, 2012, now Pat. No. 8,541,808, which is a
(Continued)

(30) Foreign Application Priority Data

Mar. 30, 2007 (JP) .................. 2007-092879

(51) Int. Cl.
*H01L 33/62* (2010.01)
*H01L 33/60* (2010.01)
*H01L 33/52* (2010.01)

(52) U.S. Cl.
CPC .............. *H01L 33/62* (2013.01); *H01L 33/52* (2013.01); *H01L 33/60* (2013.01)

(58) Field of Classification Search
CPC ........................................................ H01L 33/62
USPC ............................................................ 257/99
See application file for complete search history.

(56) References Cited

U.S. PATENT DOCUMENTS 5,062,115 A  10/1991  Thornton
5,719,663 A  2/1998  Hirai et al.
(Continued)

FOREIGN PATENT DOCUMENTS

CN  1288261  3/2001
CN  1822402  8/2006
(Continued)

OTHER PUBLICATIONS

Office Action received in the corresponding Japanese Patent application, dated Sep. 12, 2017, (2 pages) and English machine translation.

*Primary Examiner* — Eugene Lee
(74) *Attorney, Agent, or Firm* — Hamre, Schumann, Mueller & Larson, P.C.

(57) ABSTRACT

A semiconductor light-emitting device includes a lead frame, a semiconductor light-emitting element mounted on the top surface of the bonding region, and a case covering part of the lead frame. The bottom surface of the bonding region is exposed to the outside of the case. The lead frame includes a thin extension extending from the bonding region and having a top surface which is flush with the top surface of the bonding region. The thin extension has a bottom surface which is offset from the bottom surface of the bonding region toward the top surface of the bonding region.

55 Claims, 3 Drawing Sheets

Related U.S. Application Data continuation of application No. 12/890,964, filed on Sep. 27, 2010, now Pat. No. 8,154,045, which is a division of application No. 12/079,760, filed on Mar. 28, 2008, now Pat. No. 7,825,426.

(56) References Cited

U.S. PATENT DOCUMENTS

| | | | |
|---|---|---|---|
| 6,501,156 | B1 | 12/2002 | Nakanishi et al. |
| 6,809,409 | B2* | 10/2004 | Fukui ............... H01L 21/6836 257/666 |
| 6,995,510 | B2 | 2/2006 | Murakami et al. |
| 7,436,002 | B2 | 10/2008 | Brunner et al. |
| 7,655,958 | B2 | 2/2010 | Sanmyo |
| 8,680,568 | B2 | 3/2014 | Kobayakawa |
| 2002/0005573 | A1* | 1/2002 | Maeda ............... H01L 23/3107 257/678 |
| 2002/0041011 | A1* | 4/2002 | Shibata ............. H01L 23/3107 257/667 |
| 2004/0159850 | A1 | 8/2004 | Takenaka |
| 2005/0151149 | A1* | 7/2005 | Chia ..................... H01L 33/62 257/99 |
| 2005/0269587 | A1 | 12/2005 | Loh et al. |
| 2005/0280017 | A1 | 12/2005 | Oshio et al. |
| 2006/0170083 | A1 | 8/2006 | Kim et al. |
| 2008/0121921 | A1* | 5/2008 | Loh ..................... H01L 33/642 257/99 |

FOREIGN PATENT DOCUMENTS

| | | |
|---|---|---|
| JP | 2000-244022 | 9/2000 |
| JP | 2003-174200 A | 6/2003 |
| JP | 2004-22862 A | 1/2004 |
| JP | 2004-274027 | 9/2004 |
| JP | 2004-534405 A | 11/2004 |
| JP | 2005-353914 | 12/2005 |
| JP | 2006-93470 A | 4/2006 |
| JP | 2006-156704 A | 6/2006 |
| JP | 3125666 | 9/2006 |
| JP | 2006-313943 A | 11/2006 |
| JP | 2007-5378 | 1/2007 |
| JP | 2007-42755 A | 2/2007 |
| JP | 2007-59677 | 3/2007 |
| JP | 2007-67443 | 3/2007 |
| WO | WO 2003/005458 | 1/2003 |

* cited by examiner

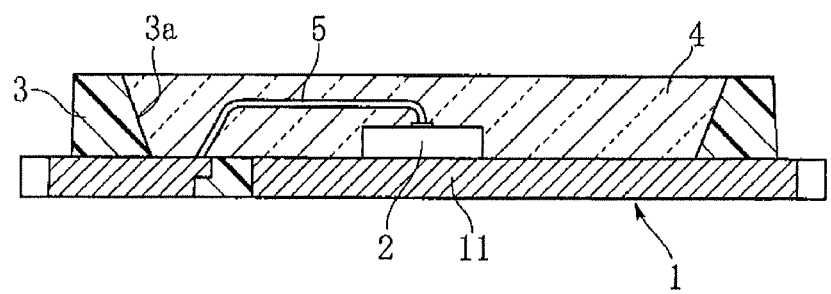
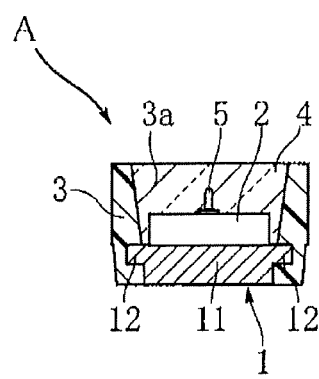
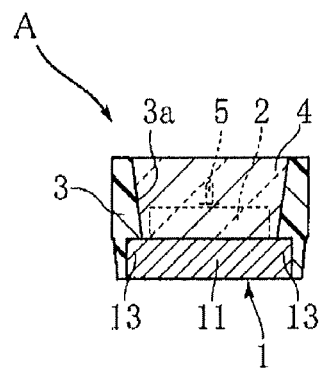

US 10,008,650 B2

SEMICONDUCTOR LIGHT-EMITTING DEVICE

This application is a Continuation of application Ser. No. 14/574,640, filed Dec. 18, 2014, which is a Continuation of application Ser. No. 14/184,173, filed Feb. 19, 2014, which is a Continuation of application Ser. No. 14/021,501, filed Sep. 9, 2013, which is a Continuation of application Ser. No. 13/414,294, filed Mar. 7, 2012, which is a Continuation of application Ser. No. 12/890,964, filed Sep. 27, 2010, which is a Division of application Ser. No. 12/079,760, filed Mar. 28, 2008, which applications are incorporated herein by reference.

BACKGROUND OF THE INVENTION

1. Field of the Invention

The present invention relates to a semiconductor light-emitting device provided with a semiconductor light-emitting element.

2. Description of the Related Art

FIGS. 6 and 7 illustrate an example of conventional semiconductor light-emitting device (see JP-A-2005-353914, for example). The illustrated semiconductor light-emitting device X includes a lead frame 91, an LED chip 92, a case 93, and a transparent resin 94. The lead frame 91 includes two strip portions, i.e., a relatively long portion 91a and a relatively short portion 91b, as seen from FIG. 6. These two portions, having the same width as seen from FIG. 7, are fitted into a lower space in the case 93 in a manner such that the bottom surface of the lead frame 91 is exposed out of the case 93. The LED chip 92 serves as a light source of the semiconductor light-emitting device X, and is bonded to the longer strip portion 91a of the lead frame 91. The LED chip 92 is connected to the shorter strip portion 91b of the lead frame 91 via a wire 95. The light-emitting device X may be mounted on a printed circuit board, for example.

In order to obtain stronger light emission from the semiconductor light-emitting device X, it is required to apply greater electrical power to the LED chip 92. Inevitably, the amount of heat generated by the LED chip 92 is increased, and for maintaining the proper light emission, the heat should be conducted from the longer strip portion 91a to the circuit board. One way to facilitate the heat conduction is to broaden the strip portion 91a (hence the lead frame 91) to which the LED chip 92 is attached.

While the width of the longer strip portion 91a is to be increased, the overall size of the case 93 may be unchanged so that the light-emitting device X is kept compact. In this case, the side walls of the case 93 need to be made thinner to permit the size increase of the longer strip portion 91a. This configuration, however, will weaken the frame-holding force of the case 93, which may allow the lead frame 91 to drop off from the case 93.

SUMMARY OF THE INVENTION

The present invention has been proposed under above-described circumstances, and thus an object of the present invention is to provide a semiconductor light-emitting device that is compact and capable of emitting bright light.

According to the present invention, there is provided a semiconductor light-emitting device comprising: a lead frame including a bonding region having a top surface and a bottom surface; a semiconductor light-emitting element mounted on the top surface of the bonding region; and a case covering part of the lead frame. The bottom surface of the bonding region is exposed to an outside of the case. The lead frame includes a thin extension extending from the bonding region and having a top surface and a bottom surface. The top surface of the thin extension is flush with the top surface of the bonding region, while the bottom surface of the thin extension is offset from the bottom surface of the bonding region toward the top surface of the bonding region.

Preferably, the semiconductor light-emitting device of the present invention may further comprise a thick extension extending from the bonding region and having a top surface and a bottom surface. The thick extension is arranged adjacent to the thin extension and is the same in thickness as the bonding region. The bottom surface of the thick extension is exposed to the outside of the case.

Other features and advantages will be apparent from the following description with reference to the accompanying drawings.

BRIEF DESCRIPTION OF THE DRAWINGS

FIG. 3 is a sectional view taken along lines III-III in FIG. 1.

FIG. 4 is a sectional view taken along lines IV-IV in FIG. 1.

FIG. 5 is a sectional view taken along lines V-V in FIG. 1.

DETAILED DESCRIPTION OF THE PREFERRED EMBODIMENTS

Preferred embodiments of the present invention will be described below with reference to the accompanying drawings.

Figure 1:
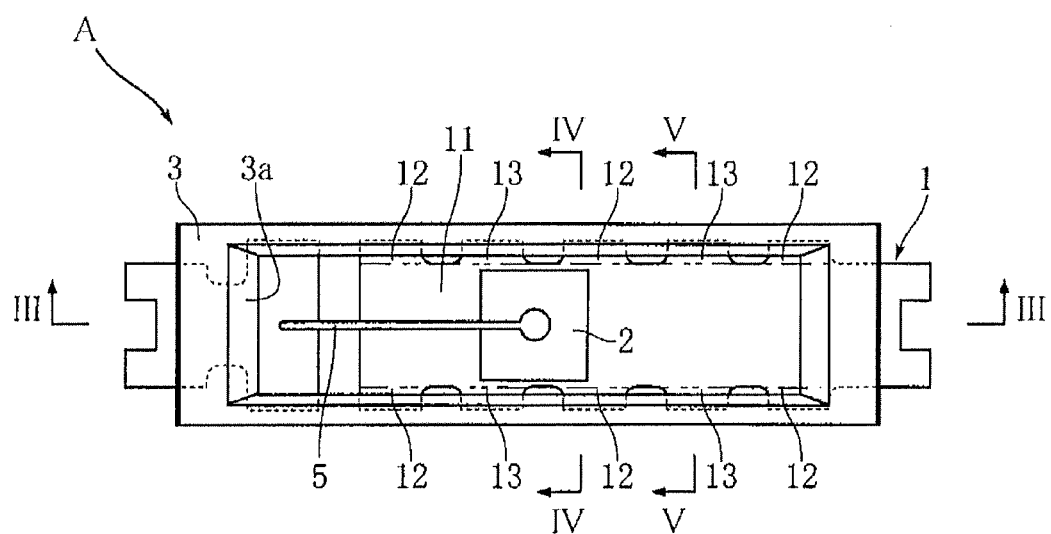
FIG. 1 is a plan view illustrating the principal portions of a semiconductor light-emitting device according to the present invention.

FIGS. 1-5 illustrate a semiconductor light-emitting device according to the present invention. The semiconductor light-emitting device A includes a lead frame 1, a light-emitting diode (LED) chip 2, a case 3, and a protection resin 4 that allows the passage of light emitted from the LED chip 2. The light-emitting device A is a small rectangular parallelepiped having a length of about 4 mm, a width of about 1 mm, and a height of about 0.6 mm. In FIG. 1, for convenience of explanation, the protection resin 4 is not shown.

Figure 2:
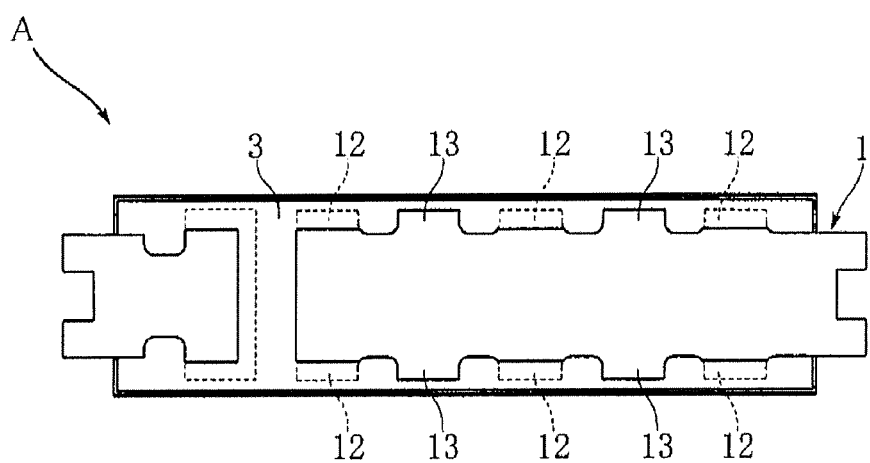
FIG. 2 is a bottom view illustrating the semiconductor light-emitting device shown in FIG. 1.
Figure 6:
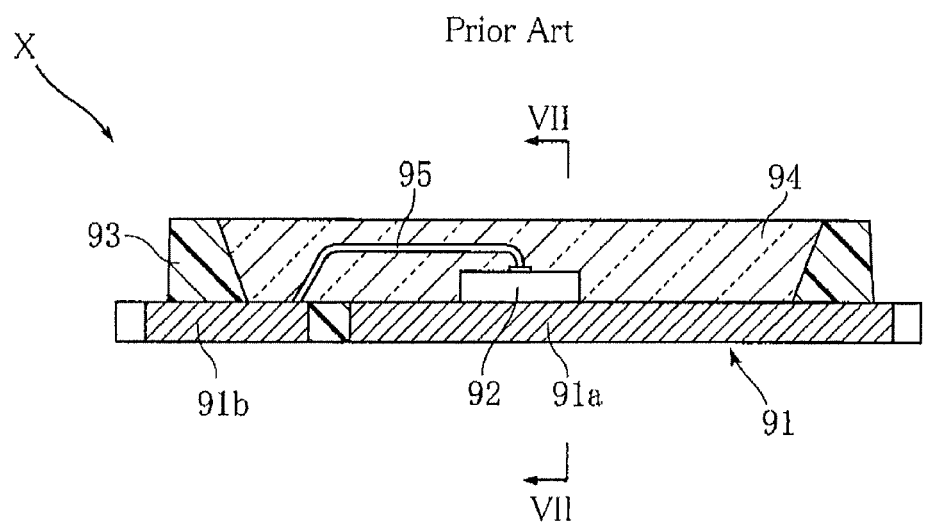
FIG. 6 is a sectional view illustrating a conventional semiconductor light-emitting device.
Figure 7:
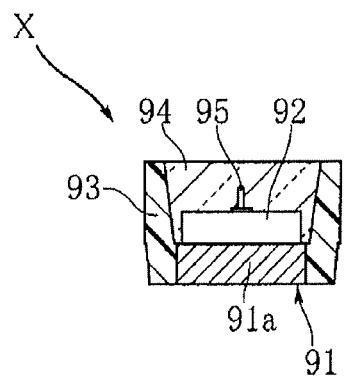
FIG. 7 is a sectional view taken along lines VII-VII in FIG. 6.

The lead frame 1 is made of Cu, Ni, or an alloy containing Cu and/or Ni. As shown in FIG. 2, the lead frame 1 is exposed out of the case 3 at its bottom surface, and is divided into a longer primary portion and a shorter secondary portion. The primary portion includes a bonding region 11, a plurality of thin extensions 12, and a plurality of thick extensions 13. In FIG. 1, the boundary between the bonding region 11 and the extensions 12, 13 is indicated by double-dot broken lines.

The bonding region 11 is a strip-shaped region on part of which the LED chip 2 is mounted. Each of the thin extensions 12 extends out from the bonding region 11, and has a thickness which is about half the thickness of the bonding region 11, for example. As shown in FIG. 4, the top surfaces of the thin extensions 12 are flush with the top surface of the bonding region 11. The bottom surfaces of the thin extensions 12 are positioned higher than the bottom surface of the bonding portion 11, as viewed vertically in FIG. 4 (in other words, the bottom surfaces of the thin extensions 12 are offset toward the top surface of the bonding region 11 from the bottom surface of the bonding region 11). The bottom surfaces of the thin extensions 12 are covered by the case 3.

As shown in FIG. 5, each of the thick extensions 13 extends out from the bonding region 11, and has a thickness which is substantially the same as the thickness of the bonding region 11. The top surfaces of the thick extensions 13 are flush with the top surface of the bonding region 11, and the bottom surfaces of the thick extensions (which are flush with the bottom surface of the bonding region 11) are exposed to the outside of the case 3. As shown in FIGS. 1 and 2, the thin extensions 12 and the thick extensions 13 are arranged alternatively in the longitudinal direction of the lead frame 1.

The LED chip 2 as a light source of the light-emitting device A is configured to emit light of a predetermined wavelength. The LED chip 2 is made of a semiconductor material such as GaN, for example, and emits blue light, green light, or red light by the recombination of electrons and holes at an active layer sandwiched by an n-type semiconductor layer and a p-type semiconductor layer. The LED chip 2 is connected to the shorter portion of the lead frame 1 via a wire 5.

The case 3 is made of a white resin, for example, and is a generally rectangular frame. As shown in FIGS. 3-5, the inner surfaces of the case 3 serve as a reflector 3a that tapers downward. The reflector 3a upwardly reflects light which is emitted laterally from the LED chip 2. As shown in FIG. 4, the case 3 is held in unreleasable engagement with the thin extensions 12. Further, as shown in FIG. 2, the case 3 is in mesh with the thin extensions 12 and the thick extensions 13.

The protection resin 4 is made of a transparent or transparent epoxy resin, for example, filled in a space defined by the case 3. The protection resin 4 covers the LED chip 2, and while protecting the LED chip 2.

Next, the functions of the semiconductor light device A will be described below.

As described above, the case 3 is held in unreleasable engagement with the thin extensions 12. Thus, the lead frame 1 is reliably held by the case 3, to be prevented from dropping off from the case 3. As a result, though the light-emitting device A has a very small width (about 1 mm), the lead frame 1 is exposed out of the case 3 in a relatively large area, as seen from FIG. 2. Therefore, heat can be efficiently conducted from the LED chip 2 to a printed circuit board, for example, which contributes to attaining light emission of desired intensity.

As described above, the thin extensions 12 and the thick extensions 13 are arranged to alternate with each other, and the bottom surfaces of the thick extensions 13 are exposed to the outside of the case 3, as shown in FIG. 2. In this manner, the exposed area of the lead frame 1 can be increased. Advantageously, this facilitates the heat dissipation from the led chip 2.

The invention claimed is:

1. A semiconductor light-emitting device, comprising:
a first lead frame having a die bonding portion and a first rest portion other than the die bonding portion, the first rest portion being not greater in thickness than the die bonding portion;
a second lead frame spaced apart from the first lead frame in a first direction and including a thick portion and a second rest portion other than the thick portion, the thick portion being equal in thickness to the die bonding portion, the second rest portion being not greater in thickness than the thick portion;
a semiconductor light-emitting element bonded to the die bonding portion and electrically connected to the second lead frame; and
a case covering a part of each of the first lead frame and the second lead frame, thereby supporting the first lead frame and the second lead frame, the case including a peripheral edge in top plan view along the first direction and a second direction perpendicular to the first direction;
wherein the first lead frame includes an extension extending in the second direction and a side surface facing in the second direction, the side surface having a nonlinear configuration in top plan view provided at least by the extension,
the extension includes a plurality of first thin extensions that are smaller in thickness than the die bonding portion and equal in length in the second direction,
the case includes a first holding portion that covers a lower surface of each of the first thin extension while exposing a continuous bottom surface of the die bonding portion and a bottom surface of the thick portion, and
the continuous bottom surface of the die bonding portion is larger than the bottom surface of the thick portion within the peripheral edge of the case in plan view.

2. The semiconductor light-emitting device according to claim 1, wherein the non-linear configuration is provided by the extension and another portion adjacent to the extension.

3. The semiconductor light-emitting device according to claim 2, wherein the non-linear configuration includes at least one protrusion provided by the extension and two other portions flanking the extension.

4. The semiconductor light-emitting device according to claim 3, wherein the non-linear configuration includes a plurality of protrusions.

5. The semiconductor light-emitting device according to claim 2, wherein the extension includes a thick extension equal in thickness to the die bonding portion.

6. The semiconductor light-emitting device according to claim 1, wherein one of the first thin extensions is located at least at a central region of the die bonding portion in the first direction.

7. The semiconductor light-emitting device according to claim 1, wherein one of the first thin extensions is located at least at an end region of the die bonding portion that is close to the second lead frame in the first direction.

8. The semiconductor light-emitting device according to claim 1, wherein one of the first thin extensions is located at least at an end region of the die bonding portion that is opposite to the second lead frame in the first direction.

9. The semiconductor light-emitting device according to claim 1, wherein the first thin extensions include a small-width thin extension that is smaller in size than the die bonding portion in the first direction.

10. The semiconductor light-emitting device according to claim 9, wherein the small-width thin extension is smaller in size than the semiconductor light-emitting element in the first direction.

11. The semiconductor light-emitting device according to claim 1, wherein the bottom surface of the die bonding portion is flush with a bottom surface of the case.

12. The semiconductor light-emitting device according to claim 1, wherein a top surface of each of the first thin extensions is flush with a top surface of the die bonding portion.

13. The semiconductor light-emitting device according to claim 1, wherein the case includes a frame portion that surrounds the semiconductor light-emitting element for reflecting light of the semiconductor light-emitting element in a light-emitting direction, and wherein the frame portion defines an opening through which the semiconductor light-emitting element, a part of the first lead frame and a part of the second lead frame are exposed from the case.

14. The semiconductor light-emitting device according to claim 13, wherein each of the first thin extensions extends in the second direction from the die bonding portion up to a point where said each of the first thin extensions overlaps with the frame portion in top plan view.

15. The semiconductor light-emitting device according to claim 13, further comprising a wire for connecting the second lead frame and the semiconductor light-emitting element to each other,
wherein the second lead frame includes a wire bonding portion for bonding the wire and a second thin extension formed integral with the wire bonding portion, the second thin extension including a lower surface located offset from a bottom surface of the thick portion in the light-emitting direction, and
the case covers a top surface of the second thin extension with the frame portion, and includes a second holding portion covering the lower surface of the second thin extension while exposing a bottom surface of the second lead frame.

16. The semiconductor light-emitting device according to claim 15, wherein the bottom surface of the second lead frame is flush with a bottom surface of the case.

17. The semiconductor light-emitting device according to claim 15, wherein the top surface of the second thin extension is flush with the wire bonding portion.

18. The semiconductor light-emitting device according to claim 15, wherein the second thin extension extends in the second direction from the wire bonding portion up to a point where the second thin extension overlaps with the frame portion in plan view.

19. The semiconductor light-emitting device according to claim 15, wherein the second lead frame includes a third thin extension formed integral with the wire bonding portion and including a lower surface located offset from the bottom surface of the thick portion in the light-emitting direction, the third thin extension being disposed at an end of the second lead frame that is close to the first lead frame, the third thin extension extending in the first direction, and
wherein the case exposes a top surface of the third thin extension and includes a third holding portion covering the lower surface of the third thin extension while exposing the bottom surface of the second lead frame.

20. The semiconductor light-emitting device according to claim 19, wherein the upper surface of the third thin extension is flush with the wire bonding portion.

21. The semiconductor light-emitting device according to claim 19, wherein the third thin extension is formed continuous with the second thin extension, and the third holding portion is formed continuous with the second holding portion.

22. The semiconductor light-emitting device according to claim 13, wherein the opening of the frame portion is rectangular in top plan view.

23. The semiconductor light-emitting device according to claim 13, further comprising a translucent resin member filled in the opening and covering the semiconductor light-emitting element, the resin member allowing light of the semiconductor light-emitting element to pass therethrough.

24. The semiconductor light-emitting device according to claim 1, wherein the first lead frame and the second lead frame are made up of an unbent lead frame.

25. The semiconductor light-emitting device according to claim 1, wherein the thin extension includes an end disposed inward of a side of the case so as to be contained in the case in top plan view.

26. The semiconductor light-emitting device according to claim 1, wherein the lower surface of the thin extension includes a flat face that is parallel to a top surface of the thin extension.

27. The semiconductor light-emitting device according to claim 1, wherein the case is made of a white resin that reflects light of the semiconductor light-emitting element.

28. The semiconductor light-emitting device according to claim 1, wherein the bottom surface of the die bonding portion is exposed from the case, and the semiconductor light-emitting element as a whole overlaps with the die bonding portion in top plan view.

29. The semiconductor light-emitting device according to claim 1, wherein the case has a rectangular outline with an edge extending in the first direction and another edge extending in the second direction.

30. The semiconductor light-emitting device according to claim 1, wherein the thick portion protrudes outward from an extremity of the case in the first direction.

31. The semiconductor light-emitting device according to claim 1, wherein each of the first lead frame and the second lead frame includes an outer end in the first direction, the outer end being formed with a cutout extending in the first direction.

32. A semiconductor light-emitting device, comprising:
a first lead frame having a die bonding portion and a first rest portion other than the die bonding portion, the first rest portion being not greater in thickness than the die bonding portion;
a second lead frame spaced apart from the first lead frame and including a thick portion and a second rest portion other than the thick portion, the thick portion being equal in thickness to the die bonding portion, the second rest portion being not greater in thickness than the thick portion;
a semiconductor light-emitting element bonded to the die bonding portion and electrically connected to the second lead frame; and
a case covering a part of each of the first lead frame and the second lead frame, thereby supporting the first lead frame and the second lead frame;
wherein the first lead frame includes an extension extending outward from the die bonding portion in top plan view and a side surface facing in an extension direction in which the extension extends, the side surface having a non-linear configuration in top plan view provided at least by the extension,
the extension includes a plurality of first thin extensions that are smaller in thickness than the die bonding portion and equal in length in the second direction,
the case includes a first holding portion that covers a lower surface of each of the first thin extensions while exposing a continuous bottom surface of the die bonding portion and a bottom surface of the thick portion, and the continuous bottom surface of the die bonding portion is larger than the bottom surface of the thick portion within a peripheral edge of the case in plan view.

33. The semiconductor light-emitting device according to claim 32, wherein the non-linear configuration is provided by the extension and another portion adjacent to the extension.

34. The semiconductor light-emitting device according to claim 33, wherein the non-linear configuration includes at least one protrusion provided by the extension and two other portions flanking the extension.

35. The semiconductor light-emitting device according to claim 34, wherein the non-linear configuration includes a plurality of protrusions.

36. The semiconductor light-emitting device according to claim 32, wherein the case includes a frame portion that surrounds the semiconductor light-emitting element for reflecting light of the semiconductor light-emitting element in a light-emitting direction, wherein the frame portion defines an opening through which the semiconductor light-emitting element, a part of the first lead frame and a part of the second lead frame are exposed from the case, and wherein each of the first thin extensions extends from the die bonding portion up to a point where said each of the first thin extensions overlaps with the frame portion in top plan view.

37. The semiconductor light-emitting device according to claim 32, wherein the first thin extensions include a small-width thin extension that is smaller in size than the die bonding portion in a width direction perpendicular to the extension direction.

38. The semiconductor light-emitting device according to claim 37, wherein the small-width thin extension is smaller in size than the semiconductor light-emitting element in the width direction.

39. The semiconductor light-emitting device according to claim 37, wherein the first thin extensions include a plurality of small-width thin extensions.

40. The semiconductor light-emitting device according to claim 32, wherein the bottom surface of the die bonding portion is flush with a bottom surface of the case.

41. The semiconductor light-emitting device according to claim 32, wherein each of the first thin extensions includes a top surface that is flush with a top surface of the die bonding portion.

42. The semiconductor light-emitting device according to claim 32, further comprising a wire for connecting the second lead frame and the semiconductor light-emitting element to each other,
wherein the second lead frame includes a wire bonding portion for bonding the wire and a second thin extension formed integral with the wire bonding portion, the second thin extension including a lower surface located offset form a bottom surface of the thick portion in a light-emitting direction,
the case includes a frame portion that surrounds the semiconductor light-emitting element for reflecting light of the semiconductor light-emitting element in a light-emitting direction, the frame portion defining an opening through which the semiconductor light-emitting element, a part of the first lead frame and a part of the second lead frame are exposed from the case, and
the case covers a top surface of the second thin extension with the frame portion and includes a second holding portion covering the lower surface of the second thin portion while exposing the bottom surface of the second lead frame.

43. The semiconductor light-emitting device according to claim 42, wherein the second thin extension extends from the wire bonding portion up to a point where the second thin extension overlaps with the frame portion in top plan view.

44. The semiconductor light-emitting device according to claim 42, wherein the second lead frame includes a third thin extension formed integral with the wire bonding portion and having a lower surface located offset from the bottom surface of the thick portion in the light-emitting direction, the third thin extension extending at an end of the second lead frame that is close to the first lead frame, and wherein the case exposes a top surface of the third thin portion and includes a third holding portion covering a lower surface of the third thin extension while exposing the bottom surface of the second lead frame.

45. The semiconductor light-emitting device according to claim 44, wherein the third thin portion includes a top surface that is flush with the wire bonding portion.

46. The semiconductor light-emitting device according to claim 44, wherein the third thin extension is continuous with the second thin extension, and the third holding portion is continuous with the second holding portion.

47. The semiconductor light-emitting device according to claim 32, wherein the thin extension includes an end disposed inward of a side of the case so as to be contained in the case in top plan view.

48. The semiconductor light-emitting device according to claim 32, wherein the lower surface of the thin extension includes a flat face that is parallel to a top surface of the thin extension.

49. The semiconductor light-emitting device according to claim 32, wherein the bottom surface of the die bonding portion is exposed from the case, and the semiconductor light-emitting element as a whole overlaps with the die bonding portion in top plan view.

50. A semiconductor light-emitting device, comprising:
a first lead frame having a die bonding portion and a first rest portion other than the die bonding portion, the first rest portion being not greater in thickness than the die bonding portion;
a second lead frame spaced apart from the first lead frame in a first direction and including a thick portion and a second rest portion other than the thick portion, the thick portion being equal in thickness to the die bonding portion, the second rest portion being not greater in thickness than the thick portion;
a semiconductor light-emitting element bonded to the die bonding portion and electrically connected to the second lead frame; and
a case covering a part of each of the first lead frame and the second lead frame, thereby supporting the first lead frame and the second lead frame, the case including a peripheral edge in top plan view along the first direction and a second direction perpendicular to the first direction;
wherein the first lead frame includes an extension extending in the second direction and a side surface facing in the second direction, the side surface having a non-linear configuration in top plan view provided at least by the extension,
the extension includes a plurality of small-width thin extensions, each of which is smaller in size in the first direction than both the die bonding portion and the semiconductor light-emitting element and smaller in thickness than the die bonding portion, the thin extensions being equal in length in the second direction, the case includes a first holding portion that covers a lower surface of one of the thin extensions while exposing a continuous bottom surface of the die bonding portion and a bottom surface of the thick portion, and the continuous bottom surface of the die bonding portion is larger than the bottom surface of the thick portion within the peripheral edge of the case in plan view.

51. The semiconductor light-emitting device according to claim 50, wherein the bottom surface of the die bonding portion is flush with a bottom surface of the case.

52. The semiconductor light-emitting device according to claim 51, wherein a top surface of each of the thin extensions is flush with a top surface of the die bonding portion.

53. A semiconductor light-emitting device, comprising:
a first lead frame having a die bonding portion and a first rest portion other than the die bonding portion, the first rest portion being not greater in thickness than the die bonding portion;
a second lead frame spaced apart from the first lead frame and including a thick portion and a second rest portion other than the thick portion, the thick portion being equal in thickness to the die bonding portion, the second rest portion being not greater in thickness than the thick portion;
a semiconductor light-emitting element bonded to the die bonding portion and electrically connected to the second lead frame; and
a case covering a part of each of the first lead frame and the second lead frame, thereby supporting the first lead frame and the second lead frame;

wherein the first lead frame includes an extension extending outward from the die bonding portion in top plan view and a side surface facing in an extension direction in which the extension extends, the side surface having a non-linear configuration in top plan view provided at least by the extension, the extension includes a plurality of small-width thin extensions, each of which is smaller in size in a width direction perpendicular to the extension direction than both the die bonding portion and the semiconductor light-emitting element and smaller in thickness than the die bonding portion, the thin extensions being equal in length in the second direction, the case includes a first holding portion that covers a lower surface of one of the thin extensions while exposing a continuous bottom surface of the die bonding portion and a bottom surface of the thick portion, and the continuous bottom surface of the die bonding portion is larger than the bottom surface of the thick portion within a peripheral edge of the case in plan view.

54. The semiconductor light-emitting device according to claim 53, wherein the bottom surface of the die bonding portion is flush with a bottom surface of the case.

55. The semiconductor light-emitting device according to claim 54, wherein a top surface of each of the thin extensions is flush with a top surface of the die bonding portion.

* * * * *